(12) United States Patent
Asano et al.

(10) Patent No.: US 6,903,426 B2
(45) Date of Patent: Jun. 7, 2005

(54) SEMICONDUCTOR SWITCHING DEVICE

(75) Inventors: Tetsuro Asano, Oizumi-machi (JP); Toshikazu Hirai, Oizumi-machi (JP); Mikito Sakakibara, Menuma-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 553 days.

(21) Appl. No.: 10/153,857

(22) Filed: May 24, 2002

(65) Prior Publication Data

US 2002/0187755 A1 Dec. 12, 2002

(30) Foreign Application Priority Data

Jun. 8, 2001 (JP) ........................................ 2001-173495

(51) Int. Cl.[7] ............................................. H01L 29/76
(52) U.S. Cl. ........................ 257/379; 257/401; 257/272; 257/287
(58) Field of Search ................................. 257/379, 401, 257/272, 280, 287, 536

(56) References Cited

U.S. PATENT DOCUMENTS 5,345,194 A  9/1994 Nagasako .................... 331/99
2002/0024375 A1 * 2/2002 Asano et al. ................ 327/365
2002/0145169 A1 * 10/2002 Asano et al. ................ 257/393
2002/0187755 A1 * 12/2002 Asano et al. ................. 455/83

OTHER PUBLICATIONS

NEC Corp., "C To X Band Amplifier C To X Band OSC N–Channel GaAs," Aug. 1994.

* cited by examiner

*Primary Examiner*—Mark V. Prenty
(74) *Attorney, Agent, or Firm*—Morrison & Foerster LLP

(57) ABSTRACT

A semiconductor switching device includes two FETs with different device characteristics, a common input terminal, and two output terminals. A signal transmitting FET has a gate width of 500 μm and a signal receiving FET has a gate width of 400 μm. A resistor connecting a gate electrode and a control terminal of the signal transmitting FET is tightly configured to provide expanding space for the FET. Despite the reduced size, the switching device can allow a maximum power of 22.5 dBm to pass through because of the asymmetrical device design. The switching device operates at frequencies of 2.4 GHz or higher without use of shunt FET.

12 Claims, 4 Drawing Sheets

PRIOR ART

SEMICONDUCTOR SWITCHING DEVICE

BACKGROUND OF THE INVENTION

1. Field of the Invention

The invention relates to a semiconductor switching device for switching at high frequencies, specifically to a compound semiconductor switching device operating at frequencies equal to or higher than 2.4 GHz.

2. Description of the Related Art

Mobile communication devices such as mobile telephones often utilize microwaves in the GHz range, and commonly need switching devices for high frequency signals which are used in switching circuits for changing antennas and switching circuits for transmitting and receiving such signals. A typical example of such a switching device can be found in Japanese Laid-Open Patent Application No. Hei 9-181642. Such a device often uses a field-effect transistor (called FET hereinafter) formed on a gallium arsenide (GaAs) substrate, as this material is suitable for use at high frequencies, and developments have been made in forming a monolithic microwave integrated circuit (MMIC) by integrating the aforementioned switching circuits.

FIG. 1A is a cross-sectional view of a conventional GaAs FET. The GaAs substrate 1 is initially without doping, and has beneath its surface an n-type channel region (or a channel layer) 2 formed by doping with n-type dopants. A gate electrode 3 is placed on the surface of the channel region 2, forming a Schottky contact, and a source electrode 4 and a drain electrode 5 are placed on both sides of the gate electrode 3, forming ohmic contacts to the surface of the channel region 2. In this transistor configuration, a voltage applied to the gate electrode 3 creates a depletion layer within the channel region 2 beneath the gate electrode 3 and, thus, controls the channel current between the source electrode 4 and the drain electrode 5.

FIG. 1B shows the basic circuit configuration of a conventional compound semiconductor switching device called a SPDT (Single Pole Double Throw) switch, using GaAs FETs. The source electrode (or the drain electrode) of each FET (FET1 and FET2) is connected to a common input terminal IN. The drain electrode (or source electrode) of each FET (FET1 and FET2) is connected to respective output terminals (OUT1 and OUT2). The gates of FET1 and FET2 are connected to the control terminals Ctl-1, Ctl-2 through resistors R1, R2, respectively. A pair of complementary signals is applied to the two control terminals, Ctl-1, Ctl-2. When a high level signal is applied to the control terminal of one of the FETs, the FET changes to an on-state, and a signal fed to the common input terminal IN passes through the FET and reaches one of the output terminals OUT1, OUT2. The role of the resistors R1 and R2 is to prevent leakage of the high frequency signals through the gate electrodes to the DC voltages applied to the control terminals Ctl-1, Ctl-2, which are substantially grounded at a high frequency.

The switching device shown in FIG. 1B must have shunts, which lead leaking signals to the ground, to attain a high degree of isolation. Alternatively, the gate width may be reduced to about 600 µm without utilizing shunts so that the overall size of the switching device is reduced with proper isolation, as described in commonly owned copending U.S. patent application Ser. No. 09/855,030, entitled "COMPOUND SEMICONDUCTOR DEVICE FOR SWITCHING" The disclosure of U.S. patent application Ser. No. 09/855,030 is, in its entirety, incorporated herein by reference.

The gate width may be further reduced to about 400 µm while the switching device is still able to allow a linear input power (power hereinafter) as high as 20 dBm to pass through, which is required for applications such as BLUETOOTH and Wireless LAN, as described in another commonly owned copending U.S. patent application Ser. No. 10/105,802, entitled "SEMICONDUCTOR SWITCHING DEVICE." The disclosure of U.S. patent application Ser. No. 10/105,802 is, in its entirety, incorporated herein by reference. This is achieved by using two FETs (FET1 and FET2) with different device characteristics including saturation current and pinch-off voltage.

However, the maximum power of 20 dBm may not be sufficient for other applications including ISM Band communications used in Wireless LAN with a high transmission rate.

SUMMARY OF THE INVENTION

The invention provides a semiconductor switching device including a first field effect transistor and a second field effect transistor. Each of the transistors includes a source electrode, a gate electrode and a drain electrode which are formed on the channel layer of the respective transistor. A common input terminal is connected to the source electrode or the drain electrode of the first transistor and is also connected to the source electrode or the drain electrode of the second transistor. A first output terminal is connected to the source electrode or the drain electrode of the first transistor which is not connected to the common input terminal. A second output terminal is connected to the source electrode or the drain electrode of the second transistor which is not connected to the common input terminal. The switching device also includes a first control terminal and a second control terminal. A first resistor connects the first control terminal and the gate electrode of the first transistor. The second resistor connects the second control terminal and the gate electrode of the second transistor. In this configuration, the gate electrodes of the first transistor and the second transistor receive control signals so that one of the transistors opens as a switching element and the other of the transistors closes as another switching element. The first resistor is more tightly configured than the second resistor so that the first transistor occupies a larger surface area than the second transistor. Furthermore, the first transistor operates as a signal transmitting transistor and the second transistor operates as a signal receiving transistor.

The invention also provides a semiconductor switching device including a first field effect transistor and a second field effect transistor. Each of the transistors includes a source electrode, a gate electrode and a drain electrode which are formed on the channel layer of the respective transistor. A common input terminal is connected to the source electrode or the drain electrode of the first transistor and is also connected to the source electrode or the drain electrode of the second transistor. A first output terminal is connected to the source electrode or the drain electrode of the first transistor which is not connected to the common input terminal. A second output terminal is connected to the source electrode or the drain electrode of the second transistor which is not connected to the common input terminal. The switching device also includes a first control terminal and a second control terminal. A first resistor connects the first control terminal and the gate electrode of the first transistor. The second resistor connects the second control terminal and the gate electrode of the second transistor. In this configuration, the gate electrodes of the first transistor and the second transistor receive control signals so that one of the transistors opens as a switching element and the other of the transistors closes as another switching element. The first resistor is tightly configured so that portions of the source electrode, the gate electrode and the drain electrode of the first transistor are disposed between the first control terminal and the first output terminal.

DETAILED DESCRIPTION OF THE INVENTION

An embodiment of this invention will be described hereinafter with reference to the FIGS. 2–4.

Figure 1A:
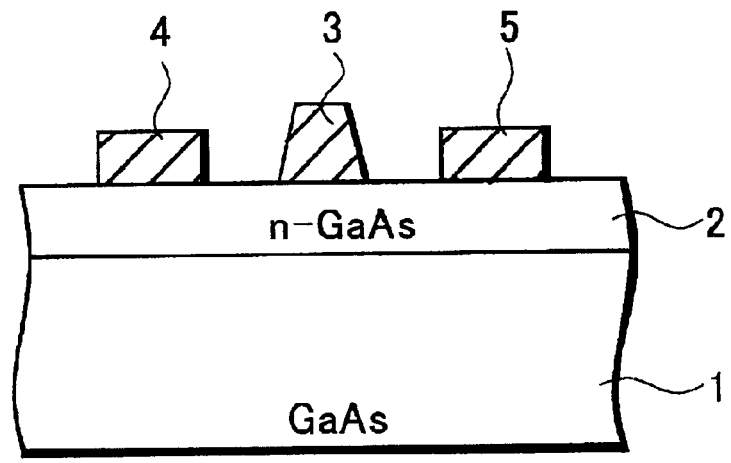
FIG. 1A is a cross-sectional view of a conventional switching device.
Figure 1B:
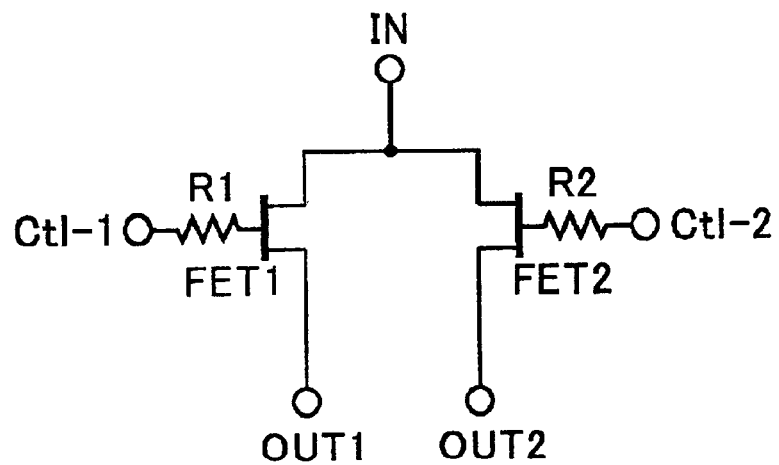
FIG. 1B is a circuit diagram of a conventional SPDT switch.
Figure 2:
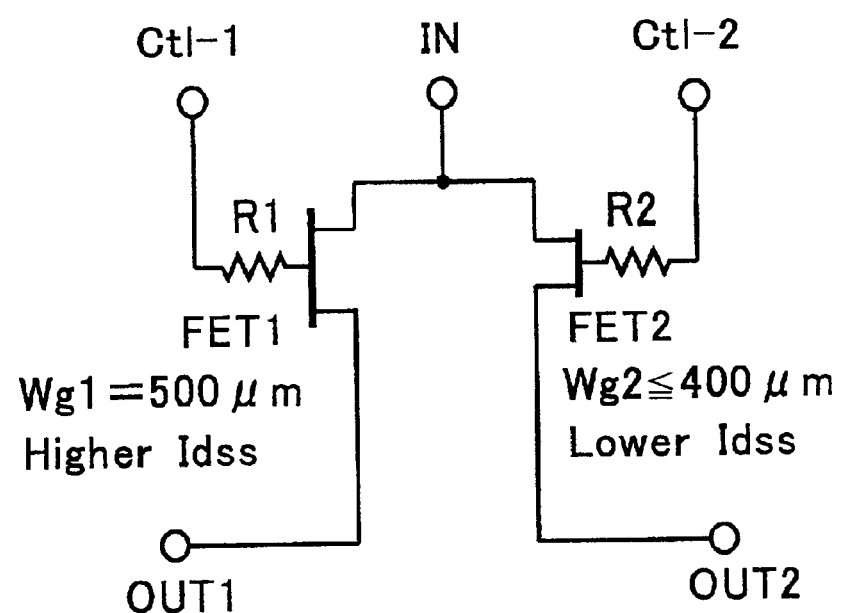
FIG. 2 is a circuit diagram of a semiconductor switching circuit device of an embodiment of this invention.

FIG. 2 is a circuit diagram of a semiconductor switching circuit device of an embodiment of this invention. The device has first and second FETs (FET1, FET2), each of which has a source electrode, a gate electrode and a drain electrode on its channel layer. The device also has a common input terminal IN connected to the source electrodes (or the drain electrodes) of the FETs (FET1, FET2), a first output terminal connected to the drain electrode (or the source electrode) of the first FET (FET1), and a second output terminal connected to the drain electrode (or the source electrode) of the second FET (FET2). The gate electrode of FET1 is connected to a control terminal Ctl-1 via resistor R1, and the gate electrode of FET2 is connected to a control terminal Ctl-2 via resistor R2. A pair of complementary signals is applied to the control terminals Ctl-1, Ctl-2 so that one of FET1 and FET2, which receives an H-level signal, turns on and connects the common input terminal and the output terminal connected to the FET, and the other of FET1 and FET2, which receives a L-level signal, remains turned off. In other words, the FET receiving the H-level signal opens as a switching element and the FET receiving the L-level signal closes as another switching element. The resistors R1, R2 prevent leaking of high frequency signals from the gate electrodes to the control terminals Ctl-1, Ctl-2.

Figure 3:
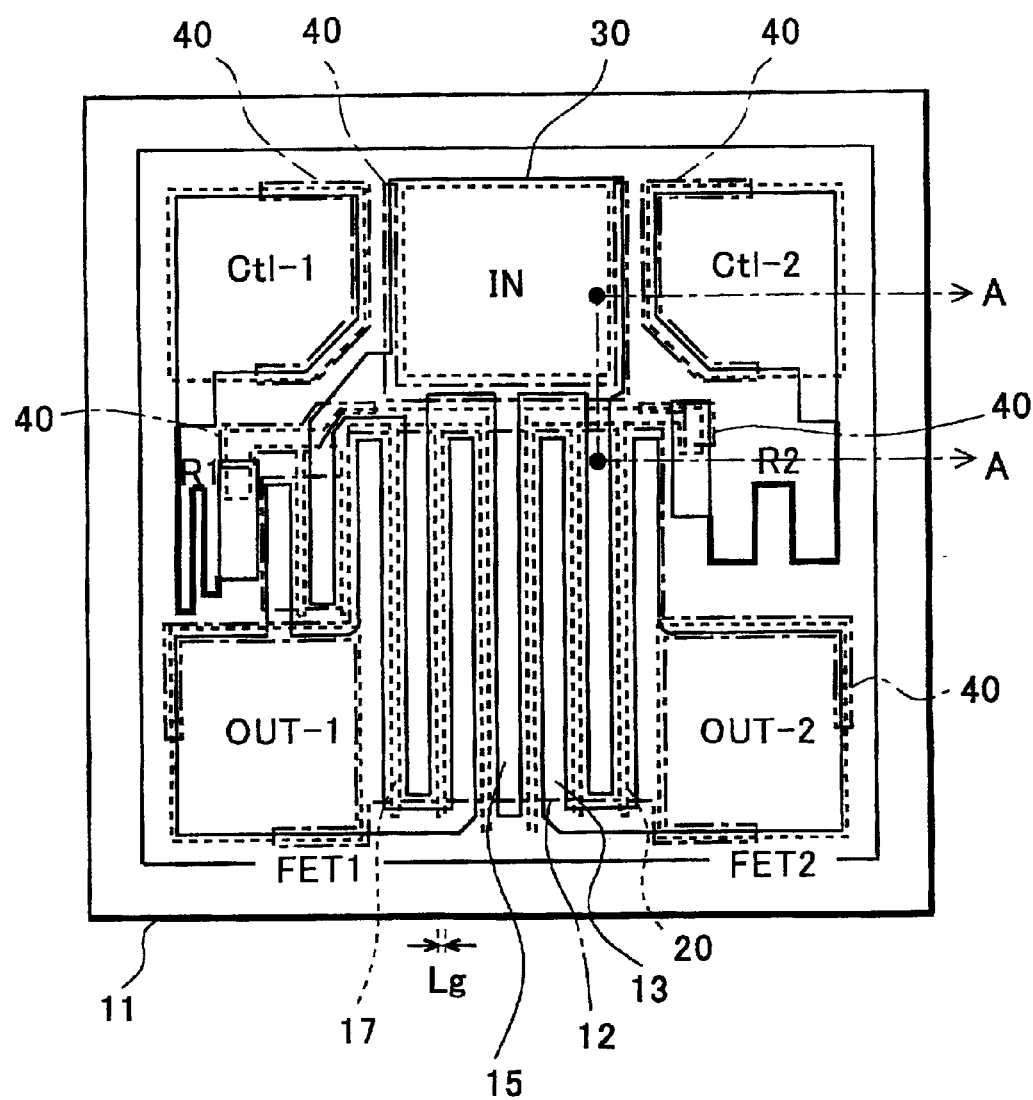
FIG. 3 is a plan view of a switching device of the embodiment of FIG. 2 integrated as a chip.

One of the characteristics of the switching device of FIG. 2 is that the gate width Wg, which is the summation of the width of each gate in the FET structure as described later with reference to FIG. 3, is different among FET1 and FET2. The transmitting FET (FET1), which is in an on-state when the switching device is transmitting signals, has a gate width Wg1 of about 500 µm. On the other hand, the receiving FET (FET2), which is in an off-state when the switching device is transmitting signals, has a gate width Wg2 equal to or less than 400 µm. This leads to different saturation currents (the saturation current will be referred to as Idss hereinafter) among FET1 and FET2. Specifically, FET1 with Wg1 can allow higher power to pass through than FET2 with Wg2 because FET1 has a higher Idss than FET2. Idss is the electric current between a drain and a source of an FET when the current between the drain and the source becomes saturated under the application of a sufficiently high voltage between the drain and the source, while keeping the source and the gate at an equal voltage.

The Idss of the FET, which turns on while transmitting signals, determines the maximum power ($P_{out1}$) in dBm as follows:

$$P_{out1} = 10 \log_{10}\{[(2R \times Idss/1.3)^2 \times 1(8R)] \times 1000\} \quad (1)$$

in which R is a load resistance, which is 50 Ω in this embodiment.

For an on-side FET, the maximum power allowed for a switching device decreases when the gate width Wg decreases because the Idss decreases accordingly, as predicted by equation 1. The term "on side" refers to an FET which turns on during a particular type of operation. In this particular instance, the on-side FET is the FET which turns on while transmitting signals. Similarly, an FET, which turns off during a particular operation, is on the off side. However, this reduction of Idss due to the reduction of the gate width Wg can be compensated for by preventing the reduction of Idss by modifying other design features of the FET. This may be accomplished by increasing the depth of the channel region or by increasing the impurity concentration of the channel layer. However, when these measures are not sufficient for obtaining an adequate Idss for a particular application, the gate width Wg may be increased.

On the off side, the FET used for receiving signals, which is turned off during signal transmission by the other FET, has to withstand the voltage required for generating the allowed maximum power of the FET used for transmitting signals while the device is transmitting signals. This can be accomplished by lowering the pinch-off voltage of the FET on the off side. The pinch-off voltage of FET can be lowered by reducing the depth of the channel layer or the impurity concentration of the channel layer. This is achieved by adjusting conditions of ion implantation into the channel layer. In general, an FET with a higher Idss has a higher pinch-off voltage and an FET with a lower Idss has a lower pinch-off voltage.

Accordingly, the FET which has a higher Idss serves substantially as a signal transmitting path. The FET which has a lower Idss serves substantially as a signal receiving path. Thus, this circuit is asymmetrical. As long as each FET conforms to its designated role, either signal transmitting or signal receiving, this asymmetrical switching device operates efficiently.

In this embodiment, Idss of the transmitting FET (FET1) is increased by making the gate width Wg relatively large (about 500 µm, but not 400 µm) and by increasing the Idss of a unit length of the gate width Wg (i.e. controlling ion implantation into the channel layer).

FIG. 3 is an example of a semiconductor switching device integrated as a compound semiconductor chip, based on the circuit design of FIG. 2. The two switching FETs (FET1 on the left, FET2 on the right) occupy the central portion of a GaAs substrate. Resistors R1, R2 are connected to the gates of the two respective FETs. The terminals, IN, OUT1, OUT2, Ctl-1, Ctl-2 occupy a significant area of the substrate surface as connecting pads. The dashed lines indicate a second layer of wiring which is formed in the same processing step as the gate electrodes of the FET and is made of a gate metal layer (Ti/Pt/Au) 20. A third layer of wiring indicated by the solid lines is for connecting the device elements and forming the connecting pads, and is made of a pad metal layer (Ti/Pt/Au) 30. A first layer contains an ohmic metal layer (AuGe/Ni/Au) 10 making an ohmic contact with the substrate, which forms the source electrode, the drain electrode and electrodes for the resistors. In FIG. 3, the first layer is not shown as it overlaps with the pad metal layer.

In FET2 of FIG. 3, the rectangular area 12 denoted by the unevenly broken line shows the channel layer formed on a GaAs substrate 11. The source electrode 13 (or the drain electrode) is formed of the pad metal layer (Ti/Pt/Au) 30 as the third layer extending from the bottom side of the drawing, has a comb-like structure having two teeth, and is connected to the output terminal OUT2. The source electrode (or the drain electrode) which is formed of the ohmic metal layer (AuGe/Ni/Au) 10 as the first layer (not shown) is formed underneath the source electrode 13. The drain electrode 15 (or the source electrode) is formed of the pad metal layer (Ti/Pt/Au) 30 as the third layer extending from the top side of the drawing, has a comb-like structure having two teeth, and is connected to the common input terminal IN. The drain electrode (or the source electrode) which is formed of the ohmic metal layer (AuGe/Ni/Au) 10 as the first layer (not shown) is formed underneath the drain electrode 15. The source electrode 13 and the drain electrode 15 are juxtaposed in a interleaved relationship to each other, and three gate electrodes 17, which are formed of the gate metal layer 20 as the second metal layer, are formed between the teeth of the combs on the channel region 12, creating another comb-like structure. In this configuration, the gate width Wg of FET2 is defined as the summation of the lengths of the gate electrode 17 within the channel layer 12 of FET2. In the construction of FIG. 3, the total length of the three teeth of the gate electrode comb-like structure 17 constitutes the gate width Wg of FET2.

FET1 has the same configuration as FET2 except that FET 1 has a larger gate width Wg than FET2. Each of the source electrode 13 and the drain electrode 15 has three teeth, rather than two. Five gate electrodes 17 are placed between the source electrode 13 and the drain electrode 15. In this configuration, the gate width Wg of FET1, the summation of the lengths of the gate electrode 17 within the channel layer 12 of FET1, is 500 $\mu$m. Both FET1 and FET2 have a gate length Lg of 0.5 $\mu$m. The middle tooth of the drain electrode 15 is shared by FET1 and FET2 to save space on the substrate.

The expanded portions of the source electrode 13, the drain electrode 15 and the gate electrode 17 of FET1 are all placed in the extra space created by tightly configuring the resistor R1.

Resistors R1, R2 are made of n+ impurity region 40 and are formed at the same time as the source and drain regions. The n+ impurity region 40 is also formed underneath the connecting pads; i.e. the common input terminal IN, the control terminals Ctl-1, Ctl-2 and the output terminals OUT1, OUT2. As indicated by the unevenly broken line in FIG. 3, the n+ impurity region 40 is formed only at the peripheral portions of the connecting pads. Alternatively, the n+ impurity region may be formed to cover the entire bottom surface of each of the connecting pads of FET1 and FET2. All the n+ impurity region 40 is formed at the same time as the formation of source and drain regions.

FIG. 3 also shows a wiring layer of the switching device of this embodiment. The wiring layer, which is denoted by reference numeral 42 in FIG. 4, is the portion of the gate metal layer 20 which is not the gate electrode of the FETs or the lower layer of the connecting pads, which will be described later with reference to FIG. 4. The wiring layer serves as a connection among the teeth of the combs (gate electrodes 17) and a connection between the connected gate electrodes 17 and the resistors. The n+ impurity region 40 is also formed underneath the wiring layer at its peripheral portions. In this embodiment of FIG. 3, a portion of the bottom surface of the wiring layer is covered by the n+ impurity region 40 at the upper right side corner of FET2 as indicated the unevenly broken line; i.e. the portion connected to the pad for the resistor R2. The n+ impurity region 40 is also formed underneath the wiring layer at the upper left side corner of FET1. Alternatively, the n+ impurity region 40 may be formed to cover the entire bottom surface of the wiring layer.

As will be described later, the presence of this n+ impurity region 40 allows for the separation among the connecting pads, wiring layers and resistors to be reduced to 4 $\mu$m, which is the minimum separation to assure an isolation of 20 dB. When the resistor R1 is tightly configured to create an extra space for the expanded portion of FET1, the separation among the portions of the resistor R1 is also reduced to 4 $\mu$m.

Portions of the gate electrode 17, the source electrode 13 and the drain electrode 15 of FET 1, which provide additional 100 $\mu$m portion of FET1, are placed in that extra space created by the tighter configuration of the resistor R1. The entire resistor R1 is also placed between the two terminals Ctl-1, OUT-1. Based on this configuration, FET1 having a gate width of 500 $\mu$m can occupy substantially the same area as FET2 having a gate width of 400 $\mu$m. Accordingly, the switching device of FIG. 3 can occupy only the same surface area as the switching device in which two FETs have a gate width of about 400 $\mu$m, even though one of the FETs of the device has a gate width of about 500 $\mu$m. In other words, the chip size of this embodiment is about 0.31×0.31 mm$^2$.

Experiments have shown that a separation of 4 $\mu$m among the connecting pads, the wiring layers and the resistors is sufficient to provide an isolation of 20 dB. An electromagnetic simulation also indicated that an isolation as high as 40 dB could be obtained at 2.4 GHz when a separation of 4 $\mu$m is provided. The role of the n+ impurity region 40 is not clear. However, it is likely that the n+ impurity region 40 can prevent a depletion layer in a GaAs substrate from extending to a neighboring electrode and thus eliminate leakage of high frequency signals to such an electrode. This observation is based on an experimental finding that a semi-insulating GaAs substrate has a limited breakdown strength, contrary to the common belief in the art.

Figure 4:
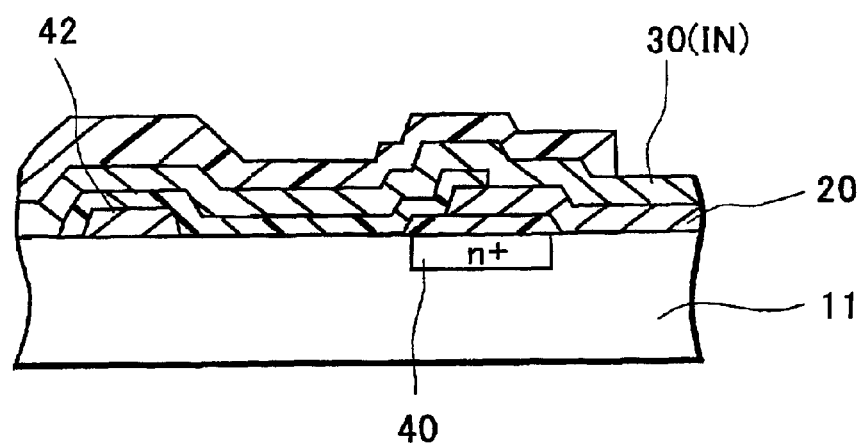
FIG. 4 is a cross-sectional view of the switching device of the embodiment cut along line A—A shown in FIG. 3.

FIG. 4 shows a cross-sectional view of the switching device of FIG. 3 cut along line A—A. The common input terminal IN includes a lower electrode, which is made of the gate metal layer 20, and an upper electrode, which is made of the pad metal layer 30. Only the pad metal layer 30 extends to and connects with the drain electrode 15 of FET2. The n+ impurity region 40 is formed underneath the gate metal layer of the common input terminal IN. As described earlier with reference to FIG. 3, the n+ impurity region 40 is formed only at the peripheral portion of the common input terminal IN in this embodiment. The wiring layer 42 made of the gate metal layer is also formed on the substrate 11. This is the portion of the gate metal layer 20 which connects the three teeth of the gate electrode comb of FET2. As described earlier with reference to FIG. 3, there is no n+ impurity region formed underneath the wiring layer in this portion of the switching device. Other parts of the shaded layered structure of FIG. 4 are all made of insulating material for insulating one conducting portion from another.

The n+ impurity region 40 may cover the entire bottom surface of the connecting pad or the wiring layer. The only requirement for this configuration is that the high frequency signal applied to the wiring layer 42 is prevented from reaching to the connecting pad. Substantially the same configuration applies to other connecting pads: i.e. Ctl-1, Ctl-2, OUT1, OUT2.

The role of the resistors R1 and R2 is to prevent the leakage of the high frequency signals through the gate electrodes to the DC voltages applied to the control terminals Ctl-1, Ctl-2, which are substantially grounded at a high frequency. When the control terminals Ctl-1, Ctl-2 are brought close to the wiring layer 42, high frequency signals of the wiring layer 42 reach the control terminals Ctl-1, Ctl-2 via the depletion layer extending from the wiring layer 42. Accordingly, signals leak to the control terminals Ctl-1, Ctl-2. However, the n+ impurity region 40 underneath the wiring layer 42 prevents the extension of the depletion layer and thus prevents high frequency signal leakage.

In the switching device of FIG. 3, the n+ impurity region 40 is formed on the substrate 11 underneath all the connecting pads. Therefore, unlike the substrate 11 with no impurity doped (although it is semi-insulating, the resistance rate of the substrate is $1\times10^7$ Ωcm), the impurity concentration of the n+ impurity region 40 is high (the type of ion is $^{29}Si^+$, and the concentration is $1-5\times10^{18}$ cm$^{-3}$), and the depletion layer around the connecting pads does not expand. Thus, the separation among the pads and the neighboring wiring layers can be reduced to 4 μm, which still ensures an isolation of 20 dB.

Furthermore, the common input terminal IN has the impurity region 40 along all its sides except the topside. The output terminals OUT1, OUT 2 have the impurity region 40 along all its four sides except the portion located at the corner of the chip. The control terminals Ctl-1, Ctl-2 have the impurity region 40 along its four sides of the irregular pentagon except the portion located at the corner of the chip and the portion used for the connection to the resistors R1, R2. Each peripheral portion of the connecting pads, which is not provided with the impurity region 40, is located near the edge of the chip and is free from low isolation caused by the high frequency signal leakage due to the extension of the depletion layer since there is enough separation from the neighboring connecting pads and circuit wiring.

The use of the n+ impurity region 40 makes it possible to bring the elements of the switching device closer to each other. Accordingly, some extra space is made available to allow some of the elements to occupy a larger area. Thus, the switching device of FIG. 3 can occupy only the same surface area as the switching device in which two FETs have a gate width of about 400 μm, even though one of the FET of the device has a gate width of about 500 μm. In other words, the chip size of this embodiment is about 0.31×0.31 mm².

The switching device of this embodiment has several advantages. First, the device can be housed in a SMCP6 package (1.6×1.6×0.75 mm³). This is achieved by removing the shunts from the switching device and reducing the gate width of the two FETs to 400 μm and 500 μm, respectively. The resistor connecting the gate electrode and the control terminal of the signal transmitting FET is tightly configured to provide expanding space for the FET. Second, despite the reduced size, the switching device can allow a maximum power of 22.5 dBm to pass through because of the asymmetrical device design. Third, the switching device can be used as an RF switch in the filed of Spread Spectrum Communication using 2.4 GHz ISM Band (Industrial Scientific and Medical frequency Band).

The above is a detailed description of a particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. A semiconductor switching device comprising:
a first field effect transistor and a second field effect transistor each comprising a source electrode, a gate electrode and a drain electrode which are formed on a channel layer of the respective transistor;
a common input terminal connected to the source electrode or the drain electrode of the first transistor and connected to the source electrode or the drain electrode of the second transistor;
a first output terminal connected to the source electrode or the drain electrode of the first transistor which is not connected to the common input terminal;
a second output terminal connected to the source electrode or the drain electrode of the second transistor which is not connected to the common input terminal;
a first control terminal and a second control terminal;
a first resistor connecting the first control terminal and the gate electrode of the first transistor; and
a second resistor connecting the second control terminal and the gate electrode of the second transistor, wherein
the gate electrodes of the first transistor and the second transistor receive control signals so that one of the transistors opens as a switching element and the other of the transistors closes as another switching element, and
the first resistor is more tightly configured than the second resistor so that the first transistor occupies a larger surface area than the second transistor.

2. A semiconductor switching device comprising:
a first field effect transistor and a second field effect transistor each comprising a source electrode, a gate electrode and a drain electrode which are formed on a channel layer of the respective transistor, the first transistor operating as a signal transmitting transistor and the second transistor operating as a signal receiving transistor;
a common input terminal connected to the source electrode or the drain electrode of the first transistor and connected to the source electrode or the drain electrode of the second transistor;
a first output terminal connected to the source electrode or the drain electrode of the first transistor which is not connected to the common input terminal;
a second output terminal connected to the source electrode or the drain electrode of the second transistor which is not connected to the common input terminal;
a first control terminal and a second control terminal;
a first resistor connecting the first control terminal and the gate electrode of the first transistor; and
a second resistor connecting the second control terminal and the gate electrode of the second transistor, wherein
the gate electrodes of the first transistor and the second transistor receive control signals so that one of the transistors opens as a switching element and the other of the transistors closes as another switching element, and
the first resistor is more tightly configured than the second resistor so that the first transistor occupies a larger surface area than the second transistor.

3. A semiconductor switching device comprising:
a first field effect transistor and a second field effect transistor each comprising a source electrode, a gate electrode and a drain electrode which are formed on a channel layer of the respective transistor;

a common input terminal connected to the source electrode or the drain electrode of the first transistor and connected to the source electrode or the drain electrode of the second transistor;

a first output terminal connected to the source electrode or the drain electrode of the first transistor which is not connected to the common input terminal;

a second output terminal connected to the source electrode or the drain electrode of the second transistor which is not connected to the common input terminal;

a first control terminal and a second control terminal;

a first resistor connecting the first control terminal and the gate electrode of the first transistor; and a second resistor connecting the second control terminal and the gate electrode of the second transistor, wherein the gate electrodes of the first transistor and the second transistor receive control signals so that one of the transistors opens as a switching element and the other of the transistors closes as another switching element, and the first resistor is tightly configured so that portions of the source electrode, the gate electrode and the drain electrode of the first transistor are disposed between the first control terminal and the first output terminal.

4. The semiconductor switching device of claims 1 or 3, wherein a separation between portions of the first resistor is smaller than a separation between portions of the second resistor.

5. The semiconductor switching device of claims 1 or 3, wherein a gate width of the first transistor is larger than a gate width of the second transistor.

6. The semiconductor switching device of claims 1 or 3, wherein the first and second resistors are made of a impurity region having impurities of a first type.

7. The semiconductor switching device of claim 4, wherein the separation between portions of the first transistor is sufficient to provide a predetermined isolation.

8. The semiconductor switching device of claims 1 or 3, further comprising a first impurity region having impurities of a first type, the impurity region being disposed under the common input terminal, the first control terminal, the second control terminal, the first output terminal, the second output terminal or a wiring layer of the first transistor or the second transistor, wherein the first and second resistors are made of a second impurity region having impurities of the first type.

9. The semiconductor switching device of claim 8, wherein the first impurity region covers an entire bottom surface of the common input terminal, the first control terminal, the second control terminal, the first output terminal, the second output terminal or the wiring layer of the first transistor or the second transistor, or the first impurity region covers a peripheral portion of a bottom surface of the common input terminal, the first control terminal, the second control terminal, the first output terminal, the second output terminal or the wiring layer of the first transistor or the second transistor.

10. The semiconductor switching device of claim 8, wherein a separation among the first impurity region, among the second impurity region or between the first impurity region and the second impurity region is determined to provide a predetermined isolation.

11. The semiconductor switching device of claim 6, wherein the impurity region is a same impurity region as a source region or a drain region of the first and second transistors.

12. The semiconductor switching device of claim 8, wherein the first and second impurity regions are a same impurity region as a source region or a drain region of the first and second transistors.

* * * * *